(12) United States Patent
Otagiri et al.

(10) Patent No.: US 10,705,146 B2
(45) Date of Patent: Jul. 7, 2020

(54) BATTERY STATE-OF-CHARGE ESTIMATION APPARATUS

(71) Applicant: KABUSHIKI KAISHA TOYOTA JIDOSHOKKI, Aichi (JP)

(72) Inventors: Toshio Otagiri, Kariya (JP); Hiroto Sato, Kariya (JP); Kenji Nishigaki, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 0 days.

(21) Appl. No.: 16/485,029

(22) PCT Filed: Feb. 13, 2018

(86) PCT No.: PCT/JP2018/004767
§ 371 (c)(1),
(2) Date: Aug. 9, 2019

(87) PCT Pub. No.: WO2018/155247
PCT Pub. Date: Aug. 30, 2018

(65) Prior Publication Data
US 2020/0011933 A1    Jan. 9, 2020

(30) Foreign Application Priority Data
Feb. 24, 2017   (JP) .................. 2017-032779

(51) Int. Cl.
*G01R 31/36*    (2020.01)
*G01R 31/367*   (2019.01)
*G01R 31/382*   (2019.01)

(52) U.S. Cl.
CPC ....... *G01R 31/3648* (2013.01); *G01R 31/367* (2019.01); *G01R 31/382* (2019.01)

(58) Field of Classification Search
CPC ......... H01M 10/44; H01M 2010/4271; H01M 10/488; H01M 2220/20
See application file for complete search history.

(56) References Cited

U.S. PATENT DOCUMENTS 9,500,713 B1    11/2016  Ghantous et al.
10,114,079 B2 *  10/2018  Duan ................. G01R 31/3648
(Continued)

FOREIGN PATENT DOCUMENTS

JP   2009-519701   5/2009
JP   2012-247374   12/2012
(Continued)

OTHER PUBLICATIONS

International Search Report for International Patent Application No. PCT/JP2018/004767 dated May 15, 2018, along with English translation.
(Continued)

*Primary Examiner* — Elias Desta
(74) *Attorney, Agent, or Firm* — Greenblum & Bernstein, P.L.C.

(57) ABSTRACT

A battery state-of-charge estimation apparatus includes: a storage that stores a charge SOC-OCV curve, a discharge SOC-OCV curve, and internal-division-ratio information; and a state-of-charge estimation unit, wherein: when a capacity difference between a battery before and after charging when the battery is charged when an intersection point is on the discharge SOC-OCV curve or when a capacity difference between the battery before and after discharging when the battery is discharged when an intersection point is on the charge SOC-OCV curve is less than a threshold, the state-of-charge estimation unit references the internal-division-ratio information to determine an internal division ratio; and the state-of-charge estimation unit estimates the state of charge of the battery using the determined internal
(Continued)

division ratio, the open-circuit voltage of the battery after elapse of a predetermined time period since the end of charging or discharging, the charge SOC-OCV curve, and the discharge SOC-OCV curve.

10 Claims, 7 Drawing Sheets

(56) References Cited

U.S. PATENT DOCUMENTS

| | | |
|---|---|---|
| 2006/0091861 A1 | 5/2006 | Melichar |
| 2015/0022158 A1 | 1/2015 | Osawa et al. |
| 2015/0276885 A1 | 10/2015 | K.R. et al. |
| 2015/0369869 A1 | 12/2015 | Tsuzuku et al. |
| 2016/0049821 A1* | 2/2016 | Aridome ............... H02J 7/0073 320/128 |

FOREIGN PATENT DOCUMENTS

| | | |
|---|---|---|
| JP | 2013-213808 | 10/2013 |
| WO | 2014/132491 | 9/2014 |

OTHER PUBLICATIONS

Written Opinion of the International Searching Authority for International Patent Application No. PCT/JP2018/004767 dated May 15, 2018, along with partial English translation.

* cited by examiner

BATTERY STATE-OF-CHARGE ESTIMATION APPARATUS

TECHNICAL FIELD

The present invention relates to a battery state-of-charge estimation apparatus for estimating the state of charge of a battery.

BACKGROUND ART

An existing battery state-of-charge estimation apparatus estimates, by referring to a SOC-OCV curve indicating the correlation between the state-of-charge and open-circuit voltage of a battery, that a state of charge that corresponds to an open-circuit voltage of the battery is the state of charge of the battery. Patent literature 1 should be referred to.

CITATION LIST

Patent Literatures

Patent literature 1: Japanese Laid-open Patent Publication No. 2009-519701

SUMMARY OF INVENTION

Technical Problem

However, the existing battery state-of-charge estimation apparatus is such that when estimating the state of charge of a battery that exhibits considerable polarization and requires a long time to eliminate the polarization (e.g., a lithium-ion battery using a negative electrode containing silicon), a SOC-OCV curve obtained after the battery is charged is not the same as a SOC-OCV curve obtained after the battery is discharged. Hence, a state of charge that corresponds to an open-circuit voltage cannot be uniquely determined, and thus the accuracy in estimation could be decreased.

An object in accordance with an aspect of the present invention is to provide a battery state-of-charge estimation apparatus capable of increasing the accuracy in estimation of the state of charge of a battery that exhibits considerable polarization and requires a long time to eliminate the polarization.

Means for Solving the Problems

A battery state-of-charge estimation apparatus in accordance with one mode of the invention includes a storage unit and a state-of-charge estimation unit.

The storage unit stores a charge SOC-OCV curve indicating the correlation between the state of charge and open-circuit voltage of a battery, a discharge SOC-OCV curve different from the charge SOC-OCV curve and indicating the correlation between the state of charge and the open-circuit voltage, and internal-division-ratio information indicating a correlation between an internal division ratio achieved when a line between the charge SOC-OCV curve and the discharge SOC-OCV curve is internally divided at a predetermined internally dividing point and a capacity difference between the battery before charging or discharging and the battery after charging or discharging.

When the capacity difference between the battery before charging or discharging and the battery after charging or discharging is equal to or greater than a threshold, the state-of-charge estimation unit estimates, by referring to the charge SOC-OCV curve or the discharge SOC-OCV curve, that a state of charge that corresponds to the open-circuit voltage is the state of charge of the battery. When the capacity difference between the battery before charging or discharging and the battery after charging or discharging is less than the threshold, the state-of-charge estimation unit refers to the internal-division-ratio information so as to determine an internal division ratio that corresponds to the capacity difference between the battery before charging or discharging and the battery after charging or discharging, and estimates the state of charge of the battery by using the determined internal division ratio, the open-circuit voltage, the charge SOC-OCV curve, and the discharge SOC-OCV curve.

Advantageous Effects of Invention

The present invention increases the accuracy in estimation of the state of charge of a battery that exhibits extreme polarization and requires a long time to eliminate the polarization.

DESCRIPTION OF EMBODIMENTS

Figure 1:
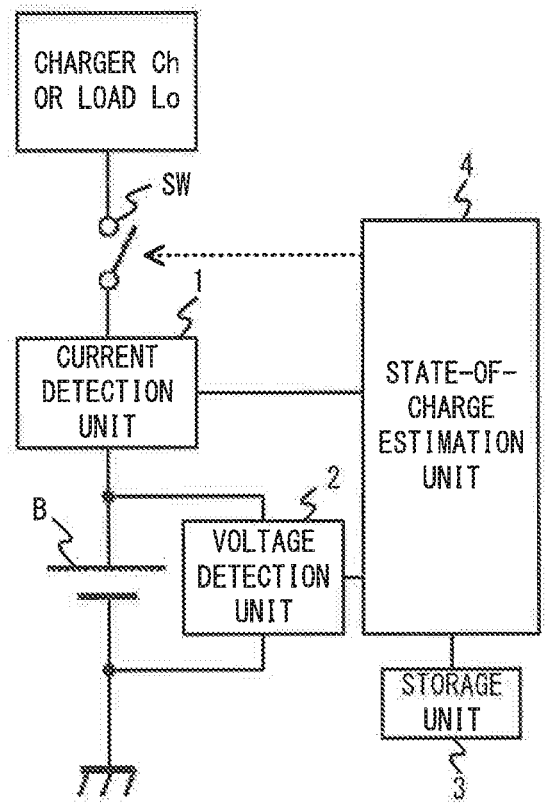
FIG. 1 illustrates an example of a battery state-of-charge estimation apparatus in accordance with embodiments.

The following describes details of embodiments by referring to the drawings.

FIG. 1 illustrates an example of a battery state-of-charge estimation apparatus in accordance with embodiments.

The battery state-of-charge estimation apparatus depicted in FIG. 1, which estimates the state of charge of a battery B, includes a switch SW, a current detection unit 1, a voltage detection unit 2, a storage unit 3, and a state-of-charge estimation unit 4.

Figure 2:
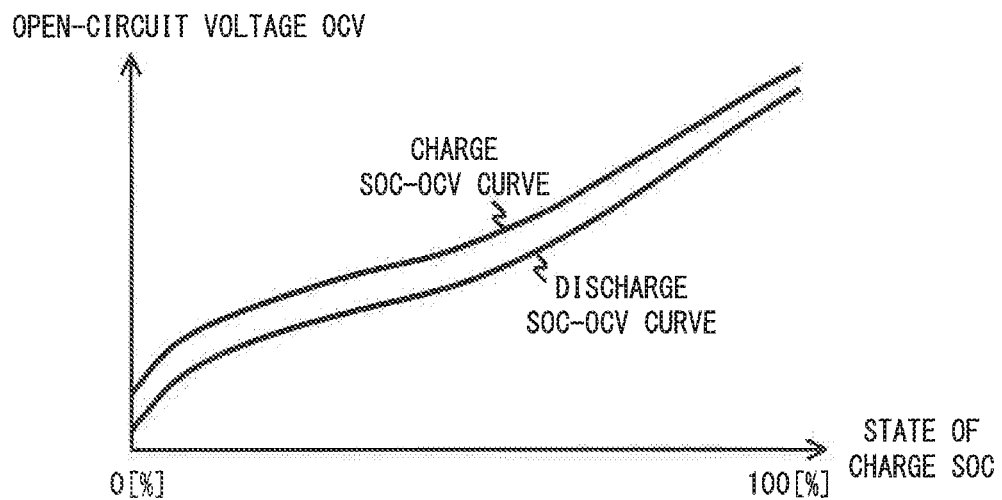
FIG. 2 illustrates examples of a charge SOC-OCV curve and a discharge SOC-OCV curve.

For example, the battery B may include one rechargeable battery (e.g., lithium-ion battery, nickel-hydrogen battery, or electric double layer capacitor) or may include two or more rechargeable batteries. The battery B is charged when power is supplied from a charger Ch to the battery B while the switch SW is conducting or when regenerative electric power is supplied from a load Lo (e.g., motor, auxiliary machine) of a vehicle Ve (e.g., hybrid vehicle, plug-in hybrid vehicle, or electric vehicle) equipped with the battery B to the battery B while the switch SW is conducting. The battery B is discharged when power is supplied from the battery B to the load Lo while the switch SW is conducting. The battery B exhibits considerable polarization and requires a long time to eliminate the polarization. As depicted in FIG. 2, a charge SOC-OCV curve indicating the correlation between the open-circuit voltage OCV and state of charge SOC of the battery B after charging is not the same as a discharge SOC-OCV curve indicating the correlation between the open-circuit voltage OCV and a state of charge SOC of the battery B after discharging. In other words, the charge SOC-OCV curve is different from the discharge SOC-OCV curve. A state of charge SOC indicates the ratio of the remaining power of the battery B to the full capacity of the battery B [%]. For example, the charge SOC-OCV curve and the discharge SOC-OCV curve, which may be obtained through a simulation or an experiment, may be obtained after a predetermined time period T1 has elapsed since the end of the charging or discharging of the battery B. Even when the battery B is slightly discharged when the intersection point of the open-circuit voltage OCV and state of charge SOC of the battery B is located on the charge SOC-OCV curve, the intersection point of the open-circuit voltage OCV and the state of charge SOC continues to be located on the charge SOC-OCV curve. Even when the battery B is slightly charged when the intersection point of the open-circuit voltage OCV and state of charge SOC of the battery B is located on the discharge SOC-OCV curve, the intersection point of the open-circuit voltage OCV and the state of charge SOC continues to be located on the discharge SOC-OCV curve.

For example, the current detection unit 1 depicted in FIG. 1 may include a hall element or a shunt resistor and detect a current I flowing through the battery B.

The voltage detection unit 2 includes an integrated circuit (IC) and detects a voltage V, i.e., the voltage of the battery B.

Figure 3:
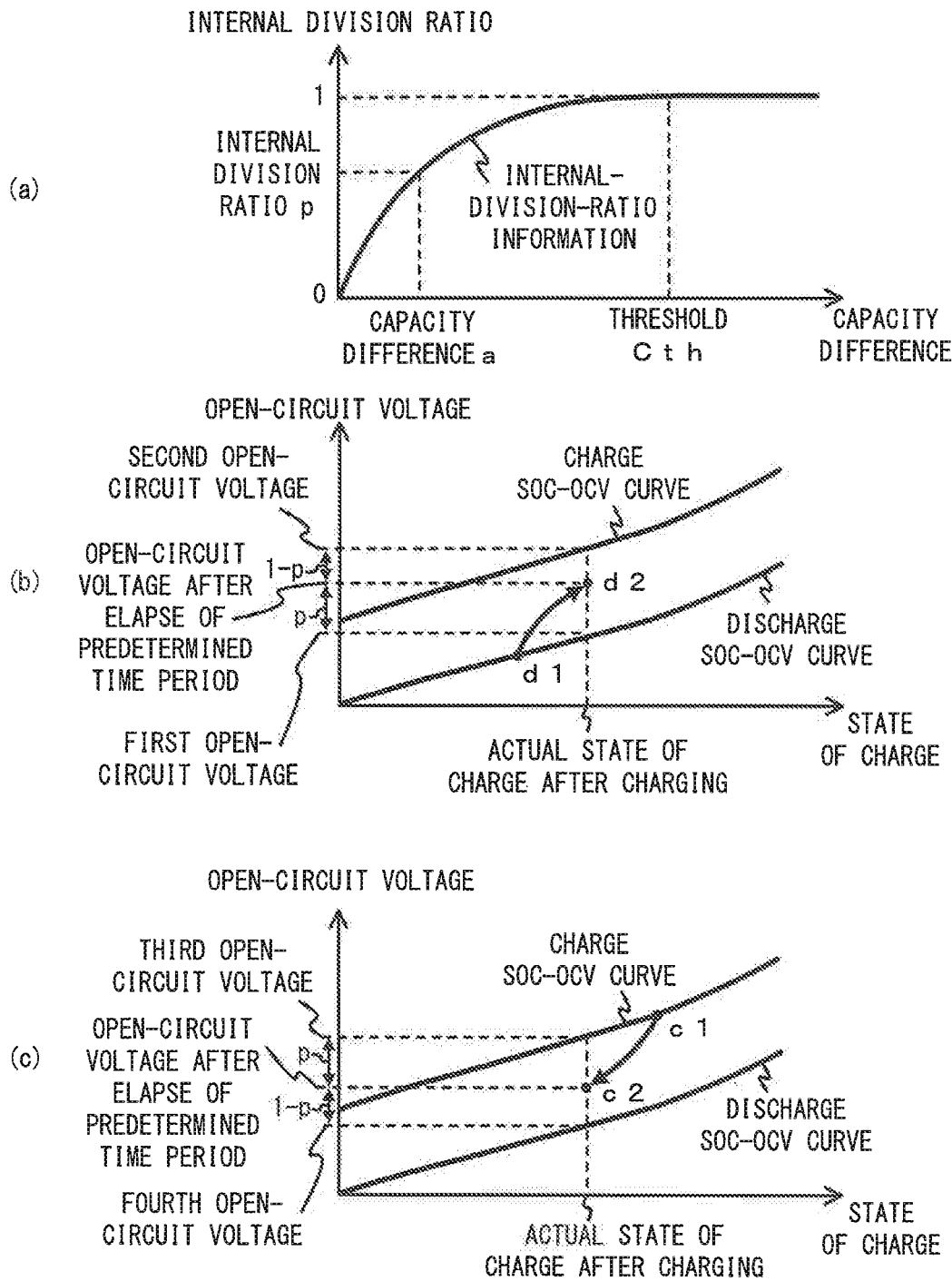
FIG. 3 illustrates an example of internal-division-ratio information.

For example, the storage unit 3 may include a read only memory (ROM) or a random access memory (RAM) and store the charge SOC-OCV curve and discharge SOC-OCV curve depicted in FIG. 2 and the internal-division-ratio information depicted in (a) in FIG. 3 that indicates the correlation between a capacity difference and an internal division ratio. An actual state of charge after charging that is depicted in (b) in FIG. 3 is, for example, a value obtained through an experiment or a simulation and is determined when the battery B is charged by a preset amount when an intersection point d1, i.e., the intersection point of the open-current voltage OCV and state of charge SOC of the battery B, is located on the discharge SOC-OCV curve. An open-circuit voltage after the elapse of a predetermined time period that is depicted in (b) in FIG. 3 is, for example, a value obtained through an experiment or a simulation and is obtained when a predetermined time period T1 has elapsed after the battery B is charged by a preset amount when the intersection point d1, i.e., the intersection point of the open-current voltage OCV and state of charge SOC of the battery B, is located on the discharge SOC-OCV curve. An actual state of charge after discharging that is depicted in (c) in FIG. 3 is, for example, a value obtained through an experiment or a simulation and is determined when the battery B is discharged by a preset amount when an intersection point c1, i.e., the intersection point of the open-current voltage OCV and state of charge SOC of the battery B, is located on the charge SOC-OCV curve. An open-circuit voltage after the elapse of a predetermined time period that is depicted in (c) in FIG. 3 is, for example, a value obtained through an experiment or a simulation and is obtained when a predetermined time period T1 has elapsed after the battery B is discharged by a preset amount when the intersection point c1, i.e., the intersection point of the open-current voltage OCV and state of charge SOC of the battery B, is located on the charge SOC-OCV curve.

When the capacity difference between the battery B after charging and the battery B before charging is equal to or greater than a threshold Cth depicted in (a) in FIG. 3, the state of charge of the battery B after charging that corresponds to the open-circuit voltage of the battery B after charging matches the state of charge SOC indicated by the charge SOC-OCV curve depicted in FIG. 2. In particular, when the battery B is charged by an amount equal to or greater than the threshold Cth when the intersection point d1, i.e., the intersection point of the open-circuit voltage OCV and state of charge SOC of the battery B that is depicted in (b) in FIG. 3, is located on the discharge SOC-OCV curve, the intersection point of the open-circuit voltage OCV and state of charge SOC of the battery B will be located on the charge SOC-OCV curve depicted in FIG. 2.

When the capacity difference between the battery B before discharging and the battery B after discharging is equal to or greater than the threshold Cth depicted in (a) in FIG. 3, the state of charge of the battery B after discharging that corresponds to the open-circuit voltage OCV of the battery B after discharging matches the state of charge SOC indicated by the discharge SOC-OCV curve depicted in FIG. 2. In particular, when the battery B is discharged by an amount equal to or greater than the threshold Cth when the intersection point c1, i.e., the intersection point of the open-circuit voltage OCV and state of charge SOC of the battery B that is depicted in (c) in FIG. 3, is located on the charge SOC-OCV curve, the intersection point of the open-circuit voltage OCV and state of charge SOC of the battery B will be on the discharge SOC-OCV curve depicted in FIG. 2.

As described above, when the battery B is charged or discharged by an amount equal to or greater than the threshold Cth, the intersection point of the open-circuit voltage OCV and state of charge SOC of the battery B after charging or discharging will be located, irrespective of the capacity of the battery B before charging or discharging, on either the charge SOC-OCV curve or discharge SOC-OCV curve depicted in FIG. 2. Hence, the state of charge of the battery B can be accurately estimated using one of the charge SOC-OCV curve or discharge SOC-OCV curve depicted in FIG. 2.

The internal division ratio indicated by the internal-division-ratio information depicted in (a) in FIG. 3 is an internal division ratio p achieved when internally dividing a line between a first open-circuit voltage and a second open-circuit voltage at p:(1−p) with the first open-circuit voltage as a reference, wherein the first open-circuit voltage corresponds to the intersection point of the discharge SOC-OCV curve and the actual state of charge of the battery B after being charged by a predetermined amount when the intersection point d1, i.e., the intersection point of the open-current voltage OCV and state of charge SOC of the battery B, is located on the discharge SOC-OCV curve, the second open-circuit voltage corresponds to the intersection point of the charge SOC-OCV curve and the actual state of charge of the battery B after being charged by a predetermined amount when the intersection point d1 is located on the discharge SOC-OCV curve, and the following open-circuit voltage is defined as a predetermined internally dividing point: an open-circuit voltage achieved when a predetermined time period T1 has elapsed after the battery B is charged by a preset amount (a value that is lower than the threshold Cth and corresponds to the capacity difference a depicted in (a) in FIG. 3) when the intersection point d1 is located on the discharge SOC-OCV curve, as depicted in (b) in FIG. 3.

Alternatively, the internal division ratio indicated by the internal-division-ratio information depicted in (a) in FIG. 3 is an internal division ratio p achieved when internally dividing a line between a third open-circuit voltage and a fourth open-circuit voltage at p:(1−p) with the third open-circuit voltage as a reference, wherein the third open-circuit voltage corresponds to the intersection point of the charge SOC-OCV curve and the actual state of charge of the battery B after being discharged by a predetermined amount when the intersection point c1, i.e., the intersection point of the open-current voltage OCV and state of charge SOC of the battery B, is located on the charge SOC-OCV curve, the fourth open-circuit voltage corresponds to the intersection point of the discharge SOC-OCV curve and the actual state of charge of the battery B after being discharged by a predetermined amount when the intersection point c1 is located on the charge SOC-OCV curve, and the following open-circuit voltage is defined as a predetermined internally dividing point: an open-circuit voltage achieved when a predetermined time period T1 has elapsed after the battery B is discharged by a preset amount (a value that is lower than the threshold Cth and corresponds to the capacity difference a depicted in (a) in FIG. 3) when the intersection point c1 is located on the charge SOC-OCV curve, as depicted in (c) in FIG. 3.

Note that the charge SOC-OCV curves and discharge SOC-OCV curves depicted in (b) and (c) in FIG. 3 and the charge SOC-OCV curves and discharge SOC-OCV curves depicted in FIGS. 5 and 6, which will be described hereinafter, correspond to enlarged views of portions of the charge SOC-OCV curve and discharge SOC-OCV curve depicted in FIG. 2.

Assume that the battery B is charged when the intersection point d1, i.e., the intersection point of the open-circuit voltage OCV and state of charge SOC of the battery B, is located on the discharge SOC-OCV curve and that the capacity difference between the battery B after charging and the battery B before charging is less than the threshold Cth. In this case, as depicted in (b) in FIG. 3, the internal division ratio obtained from the internal-division-ratio information indicates the distance from the discharge SOC-OCV curve to an intersection point d2, i.e., the intersection point of the open-circuit voltage OCV and state of charge SOC of the battery B after charging, along a line extending along the open-circuit-voltage axis between the charge SOC-OCV curve and the discharge SOC-OCV curve. Accordingly, as the internal division ratio becomes closer to 0, the intersection point d2, i.e., the intersection point of the open-circuit voltage OCV and state of charge SOC of the battery B, becomes closer to the discharge SOC-OCV curve; and as the internal division ratio becomes closer to 1, the intersection point d2, i.e., the intersection point of the open-circuit voltage OCV and state of charge SOC of the battery B, becomes closer to the charge SOC-OCV curve.

Assume that the battery B is discharged when the intersection point c1, i.e., the intersection point of the open-circuit voltage OCV and state of charge SOC of the battery B, is located on the charge SOC-OCV curve and that the capacity difference between the battery B before discharging and the battery B after discharging is less than the threshold Cth. In this case, as depicted in (c) in FIG. 3, the internal division ratio obtained from the internal-division-ratio information indicates the distance from the charge SOC-OCV curve to an intersection point c2, i.e., the intersection point of the open-circuit voltage OCV and state of charge SOC of the battery B after discharging, along a line extending along the open-circuit-voltage axis between the charge SOC-OCV curve and the discharge SOC-OCV curve. Accordingly, as the internal division ratio becomes closer to 0, an intersection point c2, i.e., the intersection point of the open-circuit voltage OCV and state of charge SOC of the battery B, becomes closer to the charge SOC-OCV curve; and as the internal division ratio becomes closer to 1, the intersection point c2, i.e., the intersection point of the open-circuit voltage OCV and state of charge SOC of the battery B, becomes closer to the discharge SOC-OCV curve.

As described above, in a case where the capacity difference between the battery B before charging and the battery B after charging is less than the threshold Cth after the battery B is charged when the intersection point d1, i.e., the intersection point of the open-circuit voltage OCV and state of charge SOC of the battery B, is located on the discharge SOC-OCV curve, the internal division ratio may be determined from the capacity difference between the battery B before charging and the battery B after charging so that the intersection point of the open-circuit voltage OCV and the state of charge SOC that is located between the charge SOC-OCV curve and the discharge SOC-OCV curve can be uniquely determined from the determined internal division ratio. The time period extending from the start of charging to the end of charging indicates a period from a time at which the charging starts and to a time at which the charging ends. Accordingly, the capacity difference between the battery B before charging and the battery B after charging indicates the capacity difference between the capacity at the start of charging and the capacity at the end of charging.

In a case where the capacity difference between the battery B before discharging and the battery B after discharging is less than the threshold Cth after the battery B is discharged when the intersection point c1, i.e., the intersection point of the open-circuit voltage OCV and state of charge SOC of the battery B, is located on the charge SOC-OCV curve, the internal division ratio may be determined from the capacity difference between the battery B before discharging and the battery B after discharging so that the intersection point of the open-circuit voltage OCV and the state of charge SOC that is located between the charge SOC-OCV curve and the discharge SOC-OCV curve can be uniquely determined from the determined internal division ratio. The time period extending from the start of discharging to the end of discharging indicates a period from a time at which the discharging starts and to a time at which the discharging ends. Accordingly, the capacity difference between the battery B before discharging and the battery B after discharging indicates the capacity difference between the capacity at the start of discharging and the capacity at the end of discharging.

The following describes an example of how to determine the internal-division-ratio information depicted in (a) in FIG. 3. In this example, the capacity of the battery B is 100 [Ah] when the state of charge is 100[%], and when the state of charge of the battery B is increased by 1[%], a capacity difference a, i.e., the capacity difference between the battery B before charging and the battery B after charging, is increased by 1 [Ah].

Assume that the state of charge of the battery B before charging that corresponds to the intersection point d1 on the discharge SOC-OCV curve depicted in (b) in FIG. 3 is 50.0[%], the state of charge of the battery B after charging that corresponds to the intersection point d2 depicted in (b) in FIG. 3 is 52.5[%], and p:(1−p) depicted in (b) in FIG. 3 is 0.6:0.4.

In such a situation, the capacity of the battery B before charging that corresponds to the intersection point d1 is 50.0 [Ah], the capacity of the battery B after charging that corresponds to the intersection point d2 is 52.5 [Ah], and a capacity difference a that is a capacity difference seen between the battery B before charging and the battery B after charging when a change from the intersection point d1 to the intersection point d2 has been made is 2.5 [Ah]=52.5 [Ah]−50.0 [Ah]. Hence, internal-division-ratio information indicating that a capacity difference a of 2.5 [Ah] and an internal division ratio p of 0.6 are correlated with each other can be obtained as internal-division-ratio information to be used when the state of charge that corresponds to the intersection point d1 on the discharge SOC-OCV curve is 50[%].

Assume that the state of charge of the battery B before charging that corresponds to the intersection point d1 on the discharge SOC-OCV curve depicted in (b) in FIG. 3 is 50.0[%], the state of charge of the battery B after charging that corresponds to the intersection point d2 depicted in (b) in FIG. 3 is 55.0[%], and p:(1−p) depicted in (b) in FIG. 3 is 0.9:0.1.

In such a situation, the capacity of the battery B before charging that corresponds to the intersection point d1 is 50.0 [Ah], the capacity of the battery B after charging that corresponds to the intersection point d2 is 55.0 [Ah], and a capacity difference a that is a capacity difference seen between the battery B before charging and the battery B after charging when a change from the intersection point d1 to the intersection point d2 has been made is 5.0 [Ah]=55.0 [Ah]−50.0 [Ah]. Hence, internal-division-ratio information indicating that a capacity difference a of 5.0 [Ah] and an internal division ratio p of 0.9 are correlated with each other can be obtained as internal-division-ratio information to be used when the state of charge that corresponds to the intersection point d1 on the discharge SOC-OCV curve is 50[%].

As described above, internal division ratios p that correspond to varying capacity differences a that are each a capacity difference seen between the battery B before charging and the battery B after charging when the battery B is charged when the intersection point of the open-circuit voltage OCV and state of charge SOC of the battery B is located on the discharge SOC-OCV curve are obtained, and the plurality of capacity differences a and internal division ratios p are plotted to determine the internal-division-ratio information depicted in (a) in FIG. 3.

When a state of charge that corresponds to the intersection point d1 is not 50[%], the internal-division-ratio information determined when the state of charge that corresponds to the intersection point d1 is 50[%] may be used. The internal division ratio may be determined not only when the state of charge that corresponds to the intersection point d1 is 50[%] but also when the state of charge that corresponds to the intersection point d1 is not 50[%]. Internal-division-ratio information may be determined not only by charging the battery B by a predetermined amount when the intersection point d1 is located on the discharge SOC-OCV curve depicted in (b) in FIG. 3 but also by discharging the battery B by a predetermined amount when the intersection point c1 is located on the charge SOC-OCV curve depicted in (c) in FIG. 3.

For example, the state-of-charge estimation unit 4 depicted in FIG. 1 may include a central processing unit (CPU), a multicore CPU, or a programmable device (e.g., field programmable gate array (FPGA), programmable logic device (PLD)).

When a capacity difference determined after charging between the battery B before charging and the battery B after charging or a capacity difference determined after discharging between the battery B before discharging and the battery B after discharging is equal to or greater than the threshold Cth, the state-of-charge estimation unit 4 estimates, by referring to the charge SOC-OCV curve or the discharge SOC-OCV curve, that a state of charge SOC that corresponds to the open-circuit voltage OCV of the battery B after elapse of a predetermined time period T2 since the end of charging or discharging is the state of charge of the battery B. The predetermined time period T2 may be or may not be equal to the predetermined time period T1.

When a capacity difference determined after charging between the battery B before charging and the battery B after charging or a capacity difference determined after discharging between the battery B before discharging and the battery B after discharging is less than the threshold Cth, the state-of-charge estimation unit 4 refers to the internal-division-ratio information so as to determine an internal division ratio that corresponds to the capacity difference and estimates the state of charge of the battery B by using the determined internal division ratio, the open-circuit voltage OCV of the battery B after elapse of the predetermined time period T2 since the end of the charging or discharging, the charge SOC-OCV curve, and the discharge SOC-OCV curve.

Figure 4:
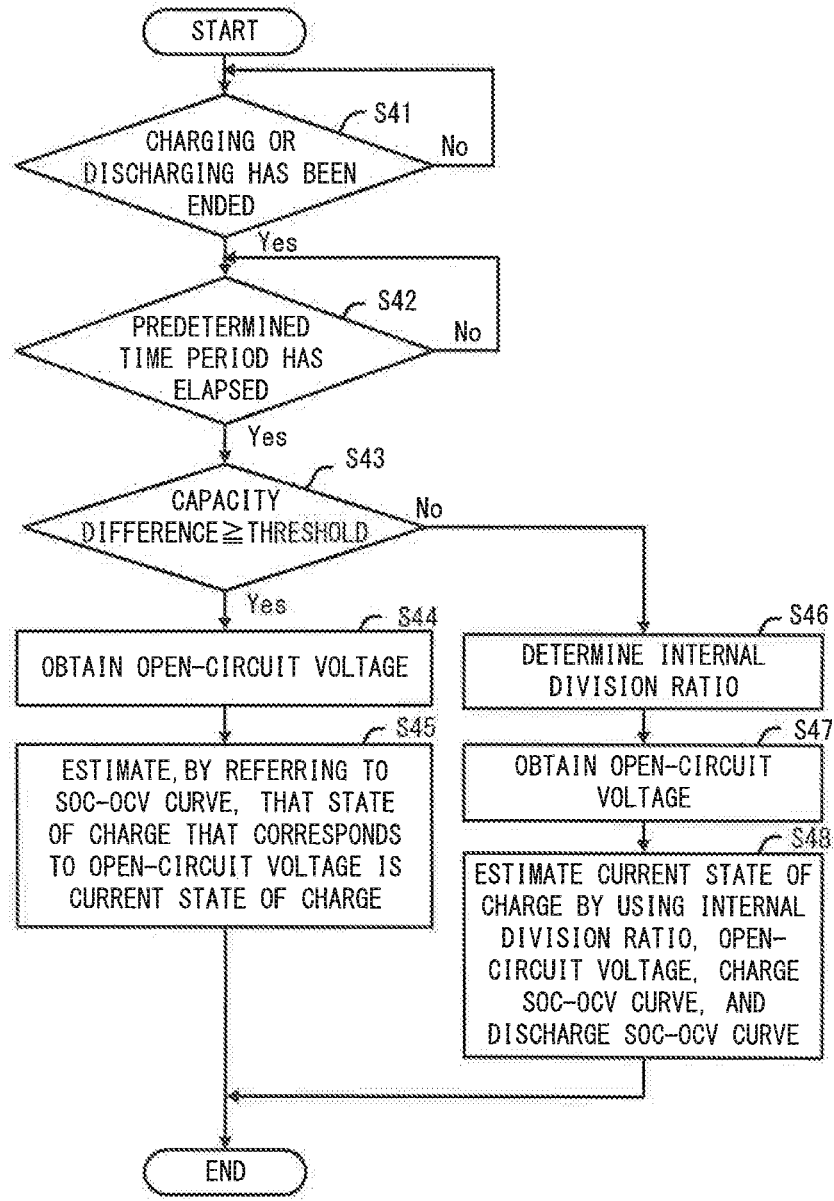
FIG. 4 is a flowchart indicating exemplary operations of a state-of-charge estimation unit.

FIG. 4 is a flowchart indicating exemplary operations of the state-of-charge estimation unit 4. Note that FIG. 4 indicates exemplary operations performed by the state-of-charge estimation unit 4 after the battery B has started to be discharged when the intersection point of the open-circuit voltage OCV and state of charge SOC of the battery B is located on the charge SOC-OCV curve or exemplary operations performed by the state-of-charge estimation unit 4 after the battery B has started to be charged when the intersection point of the open-circuit voltage OCV and state of charge SOC of the battery B is located on the discharge SOC-OCV curve.

When charging or discharging is ended (S41: Yes) and a predetermined time period T2 has elapsed since the end of the charging or discharging (S42: Yes), the state-of-charge estimation unit 4 determines whether the capacity difference between the battery before charging or discharging and the battery after charging or discharging is equal to or greater than a threshold Cth (S43).

For example, the state-of-charge estimation unit 4 may determine an integrated value ΔI [Ah] for currents I detected by the current detection unit 1 at detection timings during a period from the start to end of the charging of the battery B and define the integrated value ΔI as the capacity difference between the battery B before charging and the battery B after charging.

Alternatively, the state-of-charge estimation unit 4 may determine an integrated value ΔI [Ah] for currents I detected by the current detection unit 1 at detection timings during a period from the start to end of the discharging of the battery B and define the integrated value ΔI as the capacity difference between the battery B before discharging and the battery B after discharging.

In another option, the state-of-charge estimation unit 4 may calculate ΔSOC [%]=(|capacity of battery B before charging [Ah]−capacity of battery B after charging [Ah]|/full capacity of battery B [Ah])×100 and define this calculated ΔSOC as the capacity difference between the battery B before charging and the battery B after charging.

In still another option, the state-of-charge estimation unit 4 may calculate ΔSOC [%]=(|capacity of battery B before discharging [Ah]−capacity of battery B after discharging [Ah]|/full capacity of battery B [Ah])×100 and define this calculated ΔSOC as the capacity difference between the battery B before discharging and the battery B after discharging.

In yet another option, the state-of-charge estimation unit 4 may calculate ΔV=|voltage of battery B before charging−voltage of battery B after charging| and define this calculated ΔV as the capacity difference between the battery B before charging and the battery B after charging.

Further, the state-of-charge estimation unit 4 may calculate ΔV=|voltage of battery B before discharging-voltage of battery B after discharging| and define this calculated ΔV as the capacity difference between the battery B before discharging and the battery B after discharging.

Upon determining that the capacity difference between the battery B before charging or discharging and the battery B after charging or discharging is equal to or greater than the threshold Cth (S43: Yes), the state-of-charge estimation unit 4 obtains the open-circuit voltage OCV of the battery B after the elapse of the predetermined time period T2 in S42 (S44), refers to the charge SOC-OCV curve or discharge SOC-OCV curve stored in the storage unit 3 so as to determine a state of charge SOC that corresponds to the open-circuit voltage OCV of the battery B after the elapse of the predetermined time period T2 in S42, and estimates that the determined state of charge SOC is the state of charge of the battery B (S45).

For example, while the switch SW is off, the state-of-charge estimation unit 4 may obtain, as the open-circuit voltage OCV of the battery B, a voltage V detected by the voltage detection unit 2. Alternatively, while the battery B does not have a current flowing therethrough, the state-of-charge estimation unit 4 may obtain, as the open-circuit voltage OCV of the battery B, a voltage V detected by the voltage detection unit 2.

Accordingly, when the capacity difference between the battery B before charging and the battery B after charring is equal to or greater than the threshold Cth, the state-of-charge estimation unit 4 refers to the charge SOC-OCV curve stored in the storage unit 3 so as to determine a state of charge SOC that corresponds to the open-circuit voltage OCV of the battery B after the elapse of the predetermined time period T2 in S42, and estimates that the determined state of charge SOC is the state of charge of the battery B.

As described above, when the capacity difference between the battery B before charging and the battery B after charging is equal to or greater than the threshold Cth, the state of charge of the battery B that corresponds to the open-circuit voltage OCV of the battery B after elapse of the predetermined time period T2 since the end of charging always matches the state of charge SOC indicated by the charge SOC-OCV curve, so that the state of charge of the battery B can be uniquely estimated from the open-circuit voltage OCV of the battery B after elapse of the predetermined time period T2 since the end of charging.

When the capacity difference between the battery B before discharging and the battery B after discharging is equal to or greater than the threshold Cth, the state-of-charge estimation unit 4 refers to the discharge SOC-OCV curve stored in the storage unit 3 so as to determine the state of charge SOC of the battery B that corresponds to the open-circuit voltage OCV of the battery B after the elapse of the predetermined time period T2 since the end of discharging, and estimates that the determined state of charge SOC is the state of charge of the battery B.

As described above, when the capacity difference between the battery B before discharging and the battery B after discharging is equal to or greater than the threshold Cth, the state of charge of the battery B that corresponds to the open-circuit voltage OCV of the battery B after elapse of the predetermined time period T2 since the end of discharging always matches the state of charge SOC indicated by the discharge SOC-OCV curve, so that the state of charge of the battery B can be uniquely estimated from the open-circuit voltage OCV of the battery B after elapse of the predetermined time period T2 since the end of discharging.

Referring to FIG. 4, upon determining that the capacity difference between the battery B before charging or discharging and the battery B after charging or discharging is less than the threshold Cth (S43: No), the state-of-charge estimation unit 4 determines an internal division ratio by using the capacity difference between the battery B before charging or discharging and the battery B after charging or discharging (S46). As an example, the state-of-charge estimation unit 4 may refer to the internal-division-ratio information depicted in (a) in FIG. 3 so as to determine an internal division ratio that corresponds to the capacity difference between the battery B before charging or discharging and the battery B after charging or discharging.

The state-of-charge estimation unit 4 obtains the open-circuit voltage OCV of the battery B after the elapse of the predetermined time period T2 in S42 (S47).

The state-of-charge estimation unit 4 estimates the state of charge of the battery B by using the internal division ratio, the open-circuit voltage OCV of the battery B obtained in S47, the charge SOC-OCV curve, and the discharge SOC-OCV curve (S48).

Assume that the capacity difference between the battery B before charging and the battery B after charging that is seen when the battery B is charged when the intersection point d1, i.e., the intersection point of the open-circuit voltage OCV and state of charge SOC of the battery B, is located on the discharge SOC-OCV curve as depicted in (b) in FIG. 3 or the capacity difference between the battery B before discharging and the battery B after discharging that is seen when the battery B is discharged when the intersection point c1, i.e., the intersection point of the open-circuit voltage OCV and state of charge SOC of the battery B, is located on the charge SOC-OCV curve as depicted in (c) in FIG. 3 is the capacity difference a as depicted in (a) in FIG. 3 and that internal-division-ratio information indicates that the internal division ratio p corresponds to the capacity difference a. Note that capacity difference a<threshold Cth.

First, descriptions will be given of a situation in which the state of charge of the battery B to be achieved when the battery B is discharged when the intersection point of the open-circuit voltage OCV and state of charge SOC of the battery B is located on the charge SOC-OCV curve is estimated using the internal division ratio p with the charge SOC-OCV curve as a reference, the open-circuit voltage OCV obtained in S47, and a line extending along a vertical axis (open-circuit-voltage axis) between the charge SOC-OCV curve and the discharge SOC-OCV curve in a two-dimensional coordinate system that has, as depicted in (a) in FIG. 5, a horizontal axis indicating state of charge and a vertical axis indicating open-circuit voltage.

Figure 5:
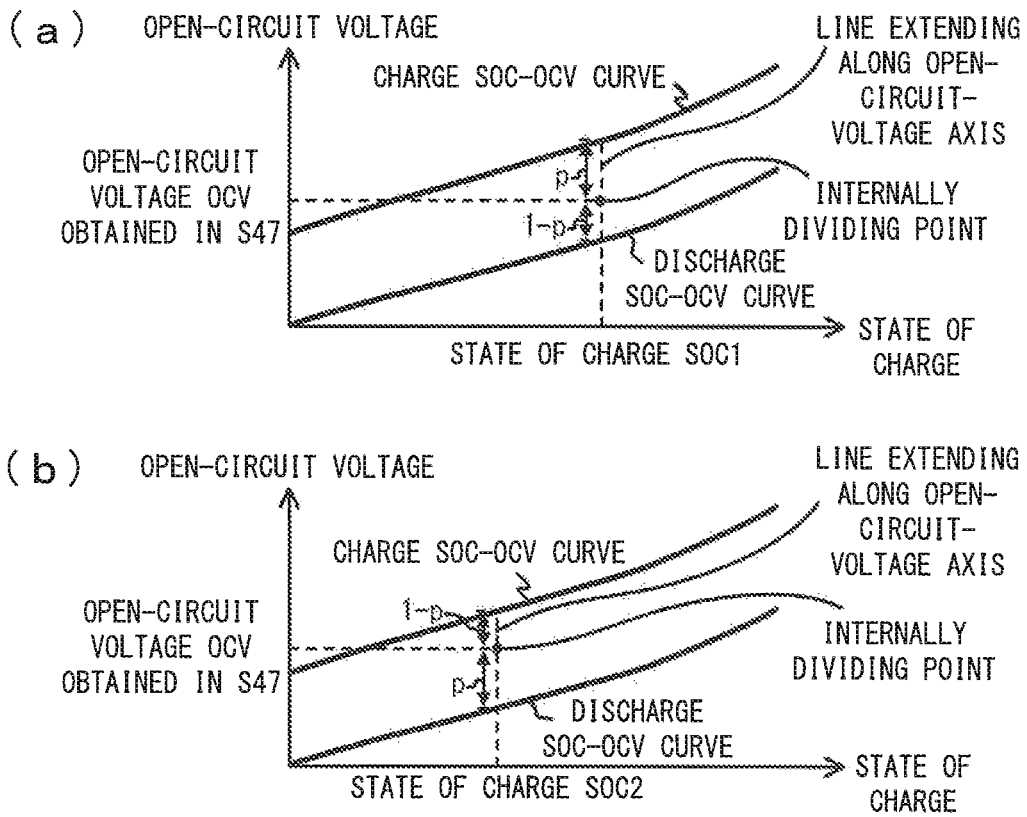
FIG. 5 illustrates an example of a method of estimating a state of charge.

When the capacity difference between the battery B before discharging and the battery B after discharging achieved when the battery B is discharged when the intersection point of the open-circuit voltage OCV and state of charge SOC of the battery B is located on the charge SOC-OCV curve is the capacity difference a, the state-of-charge estimation unit 4 estimates, to be the state of charge of the battery B, a state of charge SOC1 that corresponds to a line achieved when an internally dividing point determined according to the internal division ratio p with the charge SOC-OCV curve as a reference matches the open-circuit voltage OCV obtained in S47, from among the lines in extending along the open-circuit-voltage axis between the charge SOC-OCV curve and the discharge SOC-OCV curve (see (a) in FIG. 5).

Next, descriptions will be given of a situation in which the state of charge of the battery B to be achieved when the battery B is charged when the intersection point of the open-circuit voltage OCV and state of charge SOC of the battery B is located on the discharge SOC-OCV curve is estimated using the internal division ratio p with the discharge SOC-OCV curve as a reference, the open-circuit voltage OCV obtained in S47, and a line extending along a vertical axis (open-circuit-voltage axis) between the charge SOC-OCV curve and the discharge SOC-OCV curve in a two-dimensional coordinate system that has, as depicted in (b) in FIG. 5, a horizontal axis indicating state of charge SOC and a vertical axis indicating open-circuit voltage OCV.

When the capacity difference between the battery B before charging and the battery B after charging achieved when the battery B is charged when the intersection point of the open-circuit voltage OCV and state of charge SOC of the battery B is located on the discharge SOC-OCV curve is the capacity difference a, the state-of-charge estimation unit 4 estimates, to be the state of charge of the battery B, a state of charge SOC2 that corresponds to a line achieved when an internally dividing point determined according to the internal division ratio p with the discharge SOC-OCV curve as a reference matches the open-circuit voltage OCV obtained in S47, from among the lines in extending along the open-circuit-voltage axis between the charge SOC-OCV curve and the discharge SOC-OCV curve (see (b) in FIG. 5).

Next, descriptions will be given of a situation in which the state of charge of the battery B to be achieved when the battery B is discharged when the intersection point of the open-circuit voltage OCV and state of charge SOC of the battery B is located on the charge SOC-OCV curve is estimated using the internal division ratio p with the charge SOC-OCV curve as a reference, the open-circuit voltage OCV obtained in S47, and a line extending along a horizontal axis (stage-of-charge axis) between the charge SOC-OCV curve and the discharge SOC-OCV curve in a two-dimensional coordinate system that has, as depicted in (a) in FIG. 6, a horizontal axis indicating state of charge and a vertical axis indicating open-circuit voltage.

Figure 6:
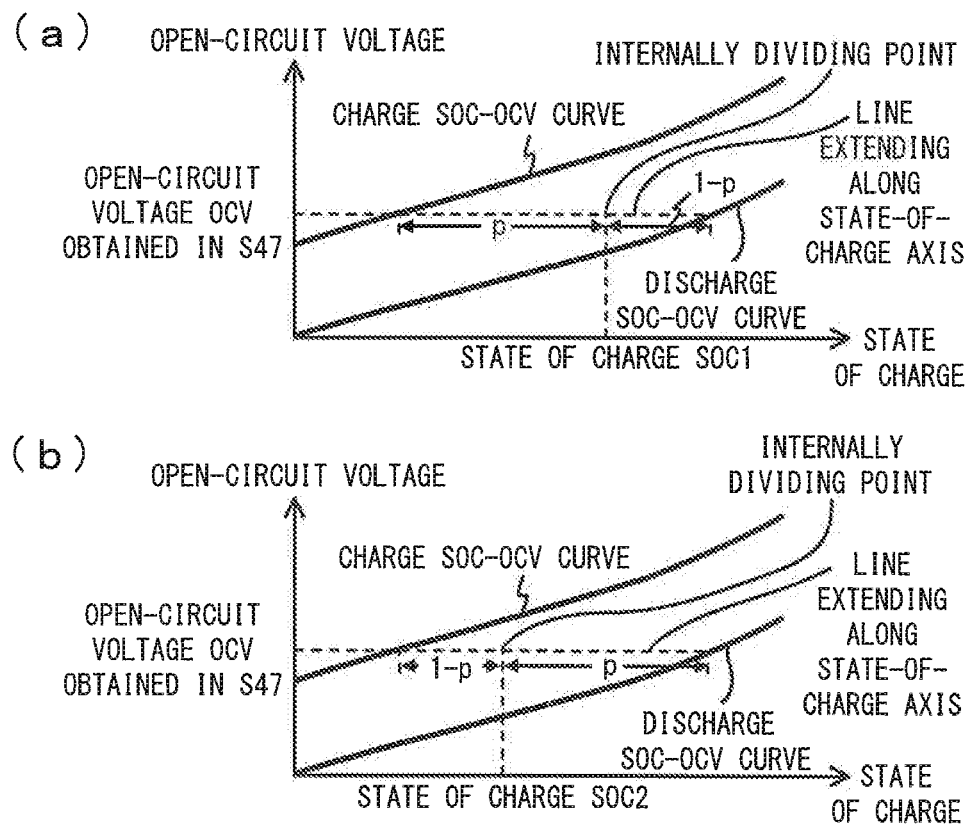
FIG. 6 illustrates another example of a method of estimating a state of charge.

When the capacity difference between the battery B before discharging and the battery B after discharging achieved when the battery B is discharged when the intersection point of the open-circuit voltage OCV and state of charge SOC of the battery B is located on the charge SOC-OCV curve is the capacity difference a, the state-of-charge estimation unit 4 estimates, to be the state of charge of the battery B, a state of charge SOC1 that corresponds to an internally dividing point determined according to the internal division ratio p with the charge SOC-OCV curve as a reference on a line extending along the state-of-charge axis that corresponds to the open-circuit voltage OCV obtained in S47, from among the lines in extending along the state-of-charge axis between the charge SOC-OCV curve and the discharge SOC-OCV curve (see (a) in FIG. 6). In other words, referring to (a) in FIG. 6, the state-of-charge estimation unit 4 estimates, to be the state of charge of the battery B, a state of charge SOC1 wherein the ratio between the distance between the internally diving point and a point on the charge SOC-OCV curve that corresponds to the open-circuit voltage OCV obtained in S47 and the distance between the internally diving point and a point on the discharge SOC-OCV curve that corresponds to the open-circuit voltage OCV of the battery B obtained in S47 is equal to the internal division ratio p.

Next, descriptions will be given of a situation in which the state of charge of the battery B to be achieved when the battery B is charged when the intersection point of the open-circuit voltage OCV and state of charge SOC of the battery B is located on the discharge SOC-OCV curve is estimated using the internal division ratio p with the discharge SOC-OCV curve as a reference, the open-circuit voltage OCV obtained in S47, a line extending along a horizontal axis (stage-of-charge axis) between the charge SOC-OCV curve and the discharge SOC-OCV curve in a two-dimensional coordinate system that has, as depicted in (b) in FIG. 6, a horizontal axis indicating state of charge and a vertical axis indicating open-circuit voltage.

When the capacity difference between the battery B before charging and the battery B after charging achieved when the battery B is charged when the intersection point of the open-circuit voltage OCV and state of charge SOC of the battery B is located on the discharge SOC-OCV curve is the capacity difference a, the state-of-charge estimation unit 4 estimates, to be the state of charge of the battery B, a state of charge SOC2 that corresponds to an internally dividing point determined according to the internal division ratio p with the discharge SOC-OCV curve as a reference on a line extending along the state-of-charge axis that corresponds to the open-circuit voltage OCV obtained in S47, from among the lines in extending along the state-of-charge axis between the charge SOC-OCV curve and the discharge SOC-OCV curve (see (b) in FIG. 6). In other words, referring to (b) in FIG. 6, the state-of-charge estimation unit 4 estimates, to be the state of charge of the battery B, a state of charge SOC2 wherein the ratio between the distance between the internally diving point and a point on the discharge SOC-OCV curve that corresponds to the open-circuit voltage OCV obtained in S47 and the distance between the internally diving point and a point on the charge SOC-OCV curve that corresponds to the open-circuit voltage OCV obtained in S47 is equal to the internal division ratio p.

As described above, when the intersection point of the open-circuit voltage OCV and state of charge SOC of the battery B is located between the charge SOC-OCV curve and the discharge SOC-OCV curve, the battery state-of-charge estimation apparatus in accordance with embodiments may determine an internal division ratio from the capacity difference between the battery B before charging or discharging and the battery B after charging or discharging and uniquely determine the intersection point of the open-circuit voltage OCV and the state of charge SOC from the determined internal division ratio, so that the state of charge can be accurately estimated from the intersection point of the open-circuit voltage OCV and the state of charge SOC that has been determined. Hence, the state of charge of the battery B that exhibits considerable polarization and requires a long time to eliminate the polarization can be estimated with increased accuracy.

As indicated in FIG. 3, an internally dividing point is determined on a line extending along the open-circuitvoltage axis when generating internal-division-ratio information. Hence, when, as indicated in FIG. 5, the state of charge of the battery B is estimated using the line extending along the open-circuit-voltage axis, the open-circuit voltage OCV of the battery B after elapse of the predetermined time period T2 since the end of charging or discharging, and the internally dividing point, the same line parameter for determining the internally dividing point can be used in generating internal-division-ratio information and in estimating the state of charge so that the accuracy in estimation of the state of charge can be increased in comparison with a situation in which, as indicated in FIG. 6, the state of charge of the battery B is estimated using the line extending along the state-of-charge axis, the open-circuit voltage OCV of the battery B after elapse of the predetermined time period T2 since the end of charging or discharging, and the internally dividing point.

The present invention is not limited to the embodiments described above and can be variously modified or changed without departing from the gist of the invention.

<Variation 1>

When a capacity difference that is seen between the battery B before charging and the battery B after charging up to a moment at which charging is switched to discharging (end of charging) after the battery B is charged (start of charging) when the intersection point of the open-circuit voltage OCV and state of charge SOC of the battery B is located on the discharge SOC-OCV curve or a capacity difference that is seen between the battery B before discharging and the battery B after discharging up to a moment at which discharging is switched to charging (end of discharging) after the battery B is discharged (start of discharging) when the intersection point of the open-circuit voltage OCV and state of charge SOC of the battery B is located on the charge SOC-OCV curve is less than the threshold Cth, the state-of-charge estimation unit 4 may refer to one of charge internal-division-ratio information and discharge internal-division-ratio information stored in the storage unit 3 so as to determine an internal division ratio that corresponds to the capacity difference up to the moment at which charging is switched to discharging or vice versa and may determine an internal division ratio that corresponds to the capacity difference after switching from charging to discharging or the capacity difference after switching from discharging to charging by using the determined internal division ratio and the other of the charge internal-division-ratio information and the discharge internal-division-ratio information.

Accordingly, when a capacity difference that is seen between the battery B before charging and the battery B after charging up to a moment at which charging is switched to discharging is less than the threshold Cth, the state-of-charge estimation unit 4 may refer to charge internal-division-ratio information stored in the storage unit 3 so as to determine an internal division ratio that corresponds to the capacity difference between the battery B before charging and the battery B after charging that is seen up to the moment at which charging is switched to discharging and may determine an internal division ratio that corresponds to the capacity difference between the battery B before discharging and the battery B after discharging that is seen after switching from charging to discharging by using the determined internal division ratio and discharge internal-division-ratio information stored in the storage unit 3.

When a capacity difference that is seen between the battery B before discharging and the battery B after discharging up to a moment at which discharging is switched to charging is less than the threshold Cth, the state-of-charge estimation unit 4 may refer to discharge internal-division-ratio information stored in the storage unit 3 so as to determine an internal division ratio that corresponds to the capacity difference between the battery B before discharging and the battery B after discharging that is seen up to the moment at which discharging is switched to charging and may determine an internal division ratio that corresponds to the capacity difference between the battery B before charging and the battery B after charging that is seen after switching from discharging to charging by using the determined internal division ratio and charge internal-division-ratio information stored in the storage unit 3.

Figure 7:
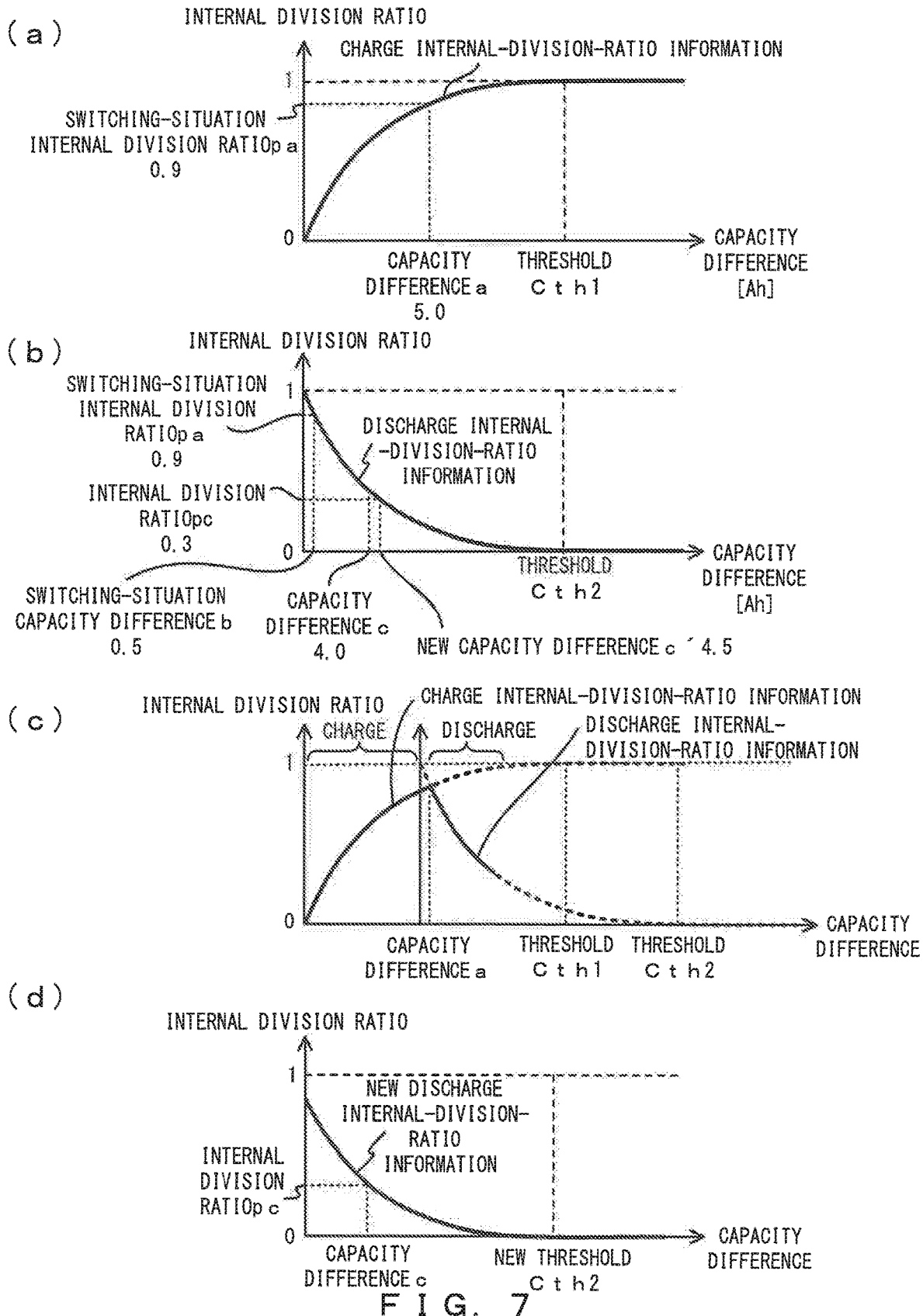
FIG. 7 illustrates examples of charge internal-division-ratio information and discharge internal-division-ratio information.

(a) in FIG. 7 depicts an example of charge internal-division-ratio information indicating the correlation between an internal division ratio and the capacity difference between the battery before charging and the battery after charging. (b) in FIG. 7 depicts an example of discharge internal-division-ratio information indicating the correlation between an internal division ratio and the capacity difference between the battery before discharging and the battery after discharging. To simplify the description in the following, both the internal division ratio indicated by the charge internal-division-ratio information depicted in (a) in FIG. 7 and the internal division ratio indicated by the discharge internal-division-ratio information depicted in (b) in FIG. 7 are provided with the discharge SOC-OCV curve as a reference. In particular, the discharge internal-division-ratio information depicted in (b) in FIG. 7 is an inversion of the charge internal-division-ratio information depicted in (a) in FIG. 7; the charge internal-division-ratio information depicted in (a) in FIG. 7 indicates that as the capacity difference between the battery before charging and the battery after charging becomes larger, the internal division ratio becomes farther from 0 and thus closer to 1; and the discharge internal-division-ratio information depicted in (b) in FIG. 7 indicates that as the capacity difference between the battery before discharging and the battery after discharging becomes larger, the internal division ratio becomes farther from 1 and thus closer to 0. The threshold Cth1 depicted in (a) in FIG. 7 and the threshold Cth2 depicted in (b) in FIG. 7 may be equal or different from each other.

<Method 1 in Accordance with Variation 1>

Assume that the battery B is charged when the intersection point of the open-circuit voltage OCV and state of charge SOC of the battery B is located on the discharge SOC-OCV curve, with the result that the intersection point of the open-circuit voltage OCV and state of charge SOC of the battery B is shifted to a position between the discharge SOC-OCV curve and the charge SOC-OCV curve and that under this condition, charging is switched to discharging.

When, as indicated in (c) in FIG. 7, a capacity difference that is seen between the battery before charging and the battery after charging up to a moment at which charging is switched to discharging (first capacity difference) is a capacity difference a (<threshold Cth1), the state-of-charge estimation unit 4 refers to charge internal-division-ratio information depicted in (a) in FIG. 7 so as to determine a switching-situation internal division ratio pa that corresponds to the capacity difference a. Subsequently, the state-of-charge estimation unit 4 refers to discharge internal-division-ratio information depicted in (b) in FIG. 7 so as to determine a switching-situation capacity difference b that corresponds to the switching-situation internal division ratio pa. After charging is switched to discharging, the state-of-charge estimation unit 4 defines the sum of a capacity difference c, i.e., the capacity difference between the battery before discharging and the battery after discharging (second capacity difference), and the switching-situation capacity difference b as a new capacity difference c' (new second capacity difference). Then, by referring to the discharge internal-division-ratio information depicted in (b) in FIG. 7, the state-of-charge estimation unit 4 defines an internal division ratio pc that corresponds to the new capacity difference c' as an internal division ratio that corresponds to a capacity difference that is seen between the battery before charging and the battery after discharging is switched to charging.

The following describes a method 1 in accordance with variation 1 by referring to numerical examples.

Assume, for example, that the battery B is charged by 5.0 [Ah] when the intersection point of the open-circuit voltage OCV and state of charge SOC of the battery B is located on the discharge SOC-OCV curve, then charging is switched to discharging, and the battery B is discharged by 4.0 [Ah].

When the battery difference a, i.e., the battery difference that is seen between the battery B before charging and the battery B after charging up to the moment at which charging is switched to discharging, is 5.0 [Ah], the state-of-charge estimation unit 4 obtains, by referring to the charge internal-division-ratio information depicted in (a) in FIG. 7, 0.9 as a switching-situation internal division ratio pa that corresponds to the capacity difference a, i.e., 5.0 [Ah]. Subsequently, the state-of-charge estimation unit 4 obtains, by referring to the discharge internal-division-ratio information depicted in (b) in FIG. 7, 0.5 [Ah] as a switching-situation capacity difference b that corresponds to the switching-situation internal division ratio pa, i.e., 0.9. Then, the state-of-charge estimation unit 4 sums a capacity difference c of 4.0 [Ah], i.e., a capacity difference that is seen between the battery B before discharging and the battery B after discharging after charging is switched to discharging, and 0.5 [Ah], i.e., the switching-situation capacity difference b, and defines the sum, i.e., 4.5 [Ah], as a new capacity difference C'. By referring to the discharge internal-division-ratio information depicted in (b) in FIG. 7, the state-of-charge estimation unit 4 obtains 0.3, which corresponds to 4.5 [Ah], i.e., the new capacity difference C', as an internal division ratio pc.

Similarly, when the status of the battery B is switched from discharging to charging, a new capacity difference is determined using a switching-situation internal division ratio and a switching-situation capacity difference.

<Method 2 in Accordance with Variation 1>

Assume that, as in the case of method 1 in accordance with variation 1, the battery B is charged when the intersection point of the open-circuit voltage OCV and state of charge SOC of the battery B is located on the discharge SOC-OCV curve, with the result that the intersection point of the open-circuit voltage OCV and state of charge SOC of the battery B is shifted to a position between the discharge SOC-OCV curve and the charge SOC-OCV curve and that under this condition, charging is switched to discharging.

When, as indicated in (c) in FIG. 7, a capacity difference that is seen between the battery before charging and the battery after charging up to the moment at which charging is switched to discharging (first capacity difference) is a capacity difference a (<threshold Cth1), the state-of-charge estimation unit 4 refers to charge internal-division-ratio information depicted in (a) in FIG. 7 so as to determine a switching-situation internal division ratio pa that corresponds to the capacity difference a. The state-of-charge estimation unit 4 also refers to discharge internal-division-ratio information depicted in (b) in FIG. 7 so as to determine a switching-situation capacity difference b that corresponds to the switching-situation internal division ratio pa. Then, as indicated in (d) in FIG. 7, the state-of-charge estimation unit 4 subtracts the switching-situation capacity difference b from each of the capacity difference and threshold Cth2 indicated by the discharge internal-division-ratio information so as to determine new discharge internal-division-ratio information (new internal-division-ratio information) and a new threshold Cth2. In other words, the charge internal-division-ratio information depicted in (a) in FIG. 7 is referred to so as to determine a switching-situation internal division ratio pa that corresponds to the capacity difference a; the discharge internal-division-ratio information depicted in (b) in FIG. 7 is referred to so as to determine a switching-situation capacity difference b that corresponds to the switching-situation internal division ratio pa; and then the discharge internal-division-ratio information and the threshold Cth2 are shifted, by the degree of the switching-situation capacity difference b, along a horizontal axis, i.e., in a capacity-difference direction, and defined as new discharge internal-division-ratio information and a new threshold Cth2, where the horizontal axis and the vertical axis respectively indicate the capacity difference and internal division ratio of the discharge internal-division-ratio information. After charging is switched to discharging, the state-of-charge estimation unit 4 refers to the new discharge internal-division-ratio information so as to determine an internal division ratio pc that corresponds to a capacity difference c, i.e., the capacity difference between the battery B before discharging and the battery B after discharging (second capacity difference).

The following describes a method 2 in accordance with variation 1 by referring to numerical examples.

Assume that, as in the case of method 1 accordance with variation 1, the battery B is charged by 5.0 [Ah] when the intersection point of the open-circuit voltage OCV and state of charge SOC of the battery B is located on the discharge SOC-OCV curve, then charging is switched to discharging, and the battery B is discharged by 4.0 [Ah].

The processes up to the process in which the state-of-charge estimation unit 4 obtains, by referring to the discharge internal-division-ratio information depicted in (b) in FIG. 7, 0.5 [Ah] as a switching-situation capacity difference b that corresponds to a switching-situation internal division ratio pa of 0.9 are the same as those in method 1, and descriptions thereof are omitted herein. After these processes are performed, the state-of-charge estimation unit 4 shifts the discharge internal-division-ratio information depicted in (b) in FIG. 7 leftward by 0.5 [Ah] along the horizontal axis (capacity difference), thereby providing new discharge internal-division-ratio information depicted in (d) in FIG. 7. In this case, when the threshold Cth2 indicated in (b) in FIG. 7 is 10 [Ah], the new threshold Cth2 depicted in (d) in FIG. 7 is 9.5 [Ah], which corresponds to the original value (10 [Ah]) with 0.5 [Ah] subtracted therefrom. Using the new discharge internal-division-ratio information depicted in (d) in FIG. 7, the state-of-charge estimation unit 4 obtains, as an internal division ratio pc, 0.3, which corresponds to a capacity difference c of 4.0 [Ah], i.e., a capacity difference that is seen between the battery B before discharging and the battery B after discharging after charging is switched from charging to discharging.

Similarly, when the status of the battery B is switched from discharging to charging, new charge internal-division-ratio information (new internal-division-ratio information)

and a new threshold Cth1 are determined using a switching-situation internal division ratio and a switching-situation capacity difference.

As described above, when charging is switched to discharging or when discharging is switched to charging, the internal division ratio just before the switching is reflected in the internal division ratio after the switching, so that the state of charge after switching from charging to discharging or from discharging to charging can be accurately estimated.

<Variation 2>

When the battery B has started to be charged by the charger Ch, the state-of-charge estimation unit 4 may determine an internal division ratio by using charge internal-division-ratio information, and when the charging of the battery B performed by the charger Ch has been completed, the state-of-charge estimation unit 4 may determine an internal division ratio by using discharge internal-division-ratio information without using the charge internal-division-ratio information even when the battery B is charged with regenerative electric power supplied from the load Lo such as a motor. In particular, upon receipt of a charge start instruction from the charger Ch, the state-of-charge estimation unit 4 determines an internal division ratio by using the charge internal-division-ratio information depicted in (a) in FIG. 7 until a charge completion instruction is received from the charger Ch; upon receipt of a charge completion instruction from the charger Ch, the state-of-charge estimation unit 4 determines an internal division ratio by using the discharge internal-division-ratio information depicted in (b) in FIG. 7 until a charge start instruction is received from the charger Ch.

As a general rule, while the vehicle Ve is traveling, a relatively small amount of regenerative electric power is supplied from the load Lo such as a motor to the battery B, and hence the intersection point of the open-circuit voltage OCV and the state of charge SOC is highly likely to be brought closer to the discharge SOC-OCV curve than to the charge SOC-OCV curve. Accordingly, when the charging of the battery B performed by the charger Ch has been completed, charge internal-division-ratio information is switched with discharge internal-division-ratio information, and when the charging of the battery B performed by the charger Ch has been started, discharge internal-division-ratio information is switched with charge internal-division-ratio information, so that while the vehicle Ve is traveling, the internal division ratio can be accurately determined using the discharge internal-division-ratio information alone. Hence, the accuracy in estimation of the state of charge can be increased in comparison with a situation in which discharge internal-division-ratio information is switched with charge internal-division-ratio information when regenerative electric power is supplied from the load Lo to the battery B while the vehicle Ve is traveling.

The start or end of the charging of the battery B performed by the charger Ch serves as a trigger to switch between charge internal-division-ratio information and discharge internal-division-ratio information. Hence, a determination can be easily made as to whether to switch between charge internal-division-ratio information and discharge internal-division-ratio information.

<Variation 3>

Assume that, as in the case of variation 2, when the battery B has started to be charged by the charger Ch, the state-of-charge estimation unit 4 determines an internal division ratio by using charge internal-division-ratio information; and when the charging of the battery B performed by the charger Ch has been completed, the state-of-charge estimation unit 4 determines an internal division ratio by using discharge internal-division-ratio information. In this case, in determining an internal division ratio by using discharge internal-division-ratio information, the state-of-charge estimation unit 4 may determine the internal division ratio by switching the discharge internal-division-ratio information with the charge internal-division-ratio information when the battery B has continuously been charged with regenerative electric power supplied from the load Lo for a predetermined time period T3 (first predetermined time period) or longer, when an inclination sensor of the vehicle Ve has continuously output a value that is equal to or higher than an inclination threshold θ for a predetermined time period T4 (second predetermined time period) or longer, or when the operation state of a mechanical brake of the vehicle Ve and the power supply state of a generator of the vehicle Ve continue to be predetermined states for a predetermined time period T5 (third predetermined time period) or longer.

Accordingly, when the vehicle Ve travels on a long sloping road, the battery B is charged with a relatively large amount of regenerative electric power, i.e., an amount of regenerative electric power that is larger than the relatively small amount of regenerative electric power indicated above with reference to variation 2, and the internal division ratio can be more accurately determined using charge internal-division-ratio information than using discharge internal-division-ratio information. In this case, the internal division ratio can be determined using the charge internal-division-ratio information, so that the accuracy in estimation of the state of charge while the vehicle Ve is traveling can be increased.

The state-of-charge estimation unit 4 may determine the internal division ratio by switching the charge internal-division-ratio information with the discharge internal-division-ratio information when the battery B is not continuously charged with regenerative electric power supplied from the load Lo for the predetermined time period T3 or longer, when the inclination sensor does not continuously output a value that is equal to or higher than the threshold θ for the predetermined time period T4 or longer, or when the operation state of the mechanical brake and the power supply state of the generator do not continue to be predetermined states for the predetermined time period T5 or longer.

EXPLANATION OF THE CODES

1: Current detection unit
2: Voltage detection unit
3: Storage unit
4: State-of-charge estimation unit
B: Battery
SW: Switch

The invention claimed is:

1. A battery state-of-charge estimation apparatus comprising:
   a storage unit that stores a charge SOC-OCV curve indicating a correlation between a state of charge and open-circuit voltage of a battery, a discharge SOC-OCV curve different from the charge SOC-OCV curve and indicating the correlation between the state of charge and the open-circuit voltage, and internal-division-ratio information indicating a correlation between an internal division ratio achieved when a line between the charge SOC-OCV curve and the discharge SOC-OCV curve is internally divided at a predetermined internally dividing point and a battery capacity difference between the battery before charging or discharging and the battery after charging or discharging; and
a state-of-charge estimation unit that, when the capacity difference is equal to or greater than a threshold, estimates, by referring to the charge SOC-OCV curve or the discharge SOC-OCV curve, that a state of charge, that corresponds to the open-circuit voltage is the state of charge of the battery, and that, when the capacity difference is less than the threshold, refers to the internal-division-ratio information so as to determine an internal division ratio that corresponds to the capacity difference, and estimates the state of charge of the battery by using the determined internal division ratio, the open-circuit voltage, the charge SOC-OCV curve, and the discharge SOC-OCV curve.

2. The battery state-of-charge estimation apparatus of claim 1, wherein
when the capacity difference is less than the threshold, the state-of-charge estimation unit estimates that a state of charge that corresponds to a fine, from among lines extending along an open-circuit-voltage axis between the charge SOC-OCV curve and the discharge SOC-OCV curve, that is achieved when an internally dividing point determined according to the determined internal division ratio matches the open-circuit voltage of the battery after elapse of a predetermined time period since an end of charging or discharging is the state of charge of the battery.

3. The battery state-of-charge estimation apparatus of claim 1, wherein
when the capacity difference is less than the threshold, the state-of-charge estimation unit estimates that a state of charge which corresponds to an internally dividing point determined according to the determined internal division ratio on a line that extends between the charge SOC-OCV curve and the discharge SOC-OCV curve along a state-of-charge axis and that corresponds to an open-circuit voltage of the battery after elapse of a predetermined time period since an end of charging or discharging is the state of charge of the battery.

4. The battery state-of-charge estimation apparatus of claim 1, wherein
the storage unit stores charge internal-division-ratio information indicating a correlation between the internal division ratio and the capacity difference between the battery before charging and the battery after charging and discharge internal-division-ratio information indicating a correlation between the internal division ratio and the capacity difference between the battery before discharging and the battery after discharging, and
when a capacity difference that is seen up to a moment at which charging is switched to discharging or discharging is switched to charging is less than the threshold, the state-of-charge estimation unit refers to one of the charge internal-division-ratio information and the discharge internal-division-ratio information so as to determine an internal division ratio that corresponds to the capacity difference that is seen up to the moment at which charging is switched to discharging or discharging is switched to charging, and determines an internal division ratio that corresponds to the capacity difference after the switching by using the determined internal division ratio and another of the charge internal-division-ratio information and the discharge internal-division-ratio information.

5. The battery state-of-charge estimation apparatus of claim 4, wherein
when a first threshold difference that is seen up to a moment at which charging is switched to discharging or discharging is switched to charging is less than the threshold, the state-of-charge estimation unit refers to one of the charge internal-division-ratio information and the discharge internal-division-ratio information so as to determine a switching-situation internal division ratio that corresponds to the first capacity difference, refers to another of the charge internal-division-ratio information and the discharge internal-division-ratio information so as to determine a switching-situation capacity difference that corresponds to the switching-situation internal division ratio, defines a sum of the switching-situation capacity difference and a second capacity difference that is the capacity difference after the switching from charging to discharging or from discharging to charging as a new second capacity difference, and refers to the other of the charge internal division-ratio information and the discharge internal-division-ratio information so as to determine an internal division ratio that corresponds to the new second capacity difference.

6. The battery state-of-charge estimation apparatus of claim 4, wherein
when a first threshold difference that is seen up to a moment at which charging is switched to discharging or discharging is switched to charging is less than the threshold, the state-of-charge estimation unit refers to one of the charge internal-division-ratio information and the discharge internal-division-ratio information so as to determine a switching-situation internal division ratio that corresponds to the first capacity difference, refers to another of the charge internal-division-ratio information and the discharge internal-division-ratio information so as to determine a switching-situation capacity difference that corresponds to the switching-situation internal division ratio, determines new internal-division-ratio information by subtracting the switching-situation capacity difference from a capacity difference indicated by the other of the charge internal-division-ratio information and the discharge internal-division-ratio information, and refers to the new internal-division-ratio information so as to determine an internal division ratio that corresponds to a second capacity difference that is the capacity difference after the switching from charging to discharging or from discharging to charging.

7. The battery state-of-charge estimation apparatus of claim 1, wherein
the storage unit stores charge internal-division-ratio information indicating a correlation between the internal division ratio and the capacity difference between the battery before charging and the battery after charging and discharge internal-division-ratio information indicating a correlation between the internal division ratio and the capacity difference between the battery before discharging and the battery after discharging, and
when the battery has started to be charged by a charger, the state-of-charge estimation unit determines the internal division ratio by using the charge internal-division-ratio information, and when the charging of the battery performed by the charger has been completed, the state-of-charge estimation unit determines the internal division ratio by using the discharge internal-division-ratio information without using the charge internaldivision-ratio information even when the battery is charged with regenerative electric power supplied from a load.

8. The battery state-of-charge estimation apparatus of claim 7, wherein
in determining the internal division ratio by using the discharge internal-division-ratio information, the state-of-charge estimation unit determines the internal division ratio by switching the discharge internal-division-ratio information with the charge internal-division-ratio information when the battery has continuously been charged with regenerative electric power supplied from a load of a vehicle equipped with the battery for a first predetermined time period or longer, when an inclination sensor of the vehicle has continuously output a value that is equal to or higher than an inclination threshold for a second predetermined time period or longer, or when an operation state of a mechanical brake of the vehicle and a power supply state of a generator of the vehicle continue to be predetermined states for a third predetermined time period or longer.

9. The battery state-of-charge estimation apparatus of claim 8, wherein
the state-of-charge estimation unit determines the internal division ratio by switching the charge internal-division-ratio information with the discharge internal-division-ratio information when the battery is not continuously charged with regenerative electric power supplied from the load for the first predetermined time period or longer, when the inclination sensor does not continuously output a value that is equal to or higher than the inclination threshold for the second predetermined time period or longer, or when the operation state of the mechanical brake of the vehicle and the power supply state of the generator of the vehicle do not continue to be the predetermined states for the third predetermined time period or longer.

10. The battery state-of-charge estimation apparatus of claim 1, wherein
the internal division ratio indicated by the internal-division-ratio information is
an internal division ratio achieved when internally dividing a line between a first open-circuit voltage and a second open-circuit voltage with the first open-circuit voltage as a reference, wherein the first open-circuit voltage corresponds to an intersection point of an actual state of charge after charging and the discharge SOC-OCV curve, the second open-circuit voltage corresponds to an intersection point of the actual state of charge after charging and the charge SOC-OCV curve, and an open-circuit voltage after elapse of a predetermined time period since charging is defined as the predetermined internally dividing point, or
an internal division ratio achieve when internally dividing a line between a third open-circuit voltage and a fourth open-circuit voltage with the third open-circuit voltage as a reference, wherein the third open-circuit voltage corresponds to an intersection point of an actual state of charge after discharging and the charge SOC-OCV curve, the fourth open-circuit voltage corresponds to an intersection point of the actual state of charge after discharging and the discharge SOC-OCV curve, and an open-circuit voltage after elapse of a predetermined time period since discharging is defined as the predetermined internally dividing point.

* * * * *